United States Patent

Hayes

[11] 3,973,193
[45] Aug. 3, 1976

[54] ELECTRIC LIGHT TESTER AND UNIT OPERATING DEVICE

[76] Inventor: John C. Hayes, 8316 Lages Lane, Baltimore, Md. 21207

[22] Filed: Apr. 14, 1975

[21] Appl. No.: 567,919

Related U.S. Application Data

[63] Continuation of Ser. No. 456,598, April 1, 1974, abandoned, which is a continuation of Ser. No. 332,352, Feb. 14, 1973, abandoned.

[52] U.S. Cl. ................................ 324/51; 324/53
[51] Int. Cl.² ...................................... G01R 31/02
[58] Field of Search ............ 324/51, 52, 53, 17, 324/19; 340/250

[56] References Cited
UNITED STATES PATENTS

| 148,289 | 3/1874 | Farmer | 324/51 |
|---|---|---|---|
| 1,372,570 | 3/1921 | Smith | 324/53 |
| 1,508,990 | 9/1924 | Schmidt | 324/53 |
| 2,131,351 | 9/1938 | Little | 324/53 |
| 2,540,471 | 2/1951 | Borsody | 324/53 |
| 2,620,379 | 12/1952 | Zimmerman | 324/53 |
| 2,705,773 | 4/1955 | Ward | 324/51 X |
| 2,946,003 | 7/1960 | Pryer | 324/53 |
| 2,976,484 | 3/1961 | McClain | 324/51 |
| 3,699,433 | 10/1972 | Smith | 324/52 |

*Primary Examiner*—Gerard R. Strecker
*Attorney, Agent, or Firm*—J. Wesley Everett

[57] ABSTRACT

A combination electrical continuity circuit tester, electric circuit controller, and trouble light comprising a flashlight type tubular body, an electric light mounted in the body having clip leads for connection to a circuit to be tested and to a power source, and a switch controlled shunt circuit providing for momentary or prolonged switching of a fused line in parallel with the lamp circuit; clip lead storage and special switch structure are also provided.

3 Claims, 7 Drawing Figures

ELECTRIC LIGHT TESTER AND UNIT OPERATING DEVICE

The present application is a continuation of application Ser. No. 456,598, filed Apr. 1, 1974, now abandoned, which in turn is a continuation of application Ser. No. 332,352, filed Feb. 14, 1973, now abandoned.

This invention relates generally to electrical devices and particularly to electrical testers and controllers.

In the most usually encountered electrical trouble shooting situations, the problems involve an open circuit where the circuit should be continuous or a short where the circuit should be open. Automobile electrical circuits are a good example, defective ignition wiring often proving to have a broken wire and defective condensers after being shorted.

In the prior art make-and-break testers have been disclosed which give a visual signal, as by turning on a lamp, to indicate electrical continuity, one example being U.S. Pat. No. 1,372,570 to R. Smith issued Mar. 22, 1921.

However, such old art devices leave much to be desired in the way of flexibility, convenience, and in some cases safety, and it is a principal object of the present invention to provide a more flexible, convenient and safe tester of the visual indication type, than previously available.

Another object is to provide a hand held type tester which is adapted to serve the triple functions of electrical tester, trouble light, and apparatus controller.

Still another object is to provide a device as described which is adapted to test circuit element such as fuses when they are removed from or before they are installed in the actual circuit in which used.

And a further object is to provide a device as described which has clip leads extensible for reaching remote points but safely self-containable for storage.

Still further objects are to provide a new and substantial advance in the field of electrical testers which is most economical to construct, being well adapted for mass production using readily available parts and techniques, which is compact, durable, failsafe, attractive in appearance, resistant to damage, and which is versatile in operation.

In brief summary, the invention comprises a frame having an electric lamp connected in series with a pair of test electrodes through flexible wiring and having a shunt circuit including a variety of switching test-arrangements.

The above and other advantages and objects of the invention will become more readily apparent on inspection of the following description, including the drawings, in which.

Like numerals refer to like parts in the drawings.

Figure 1:
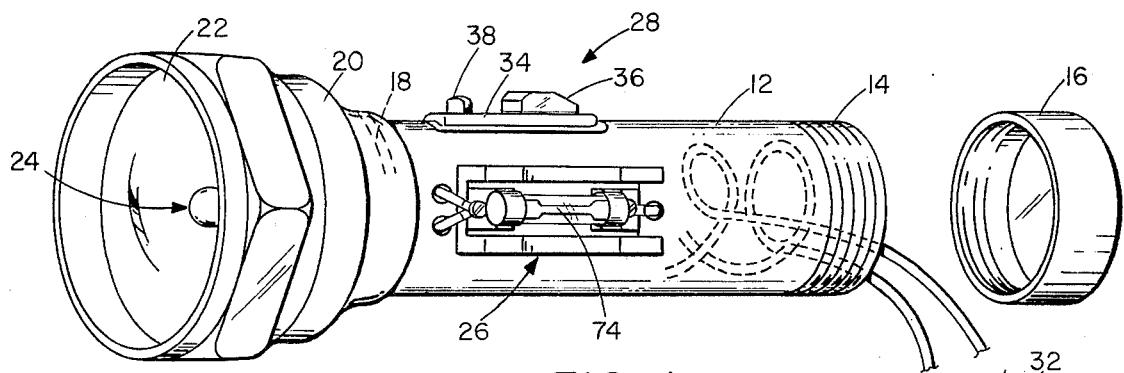
FIG. 1 is an isometric view of the invention ready for use.
Figure 2:
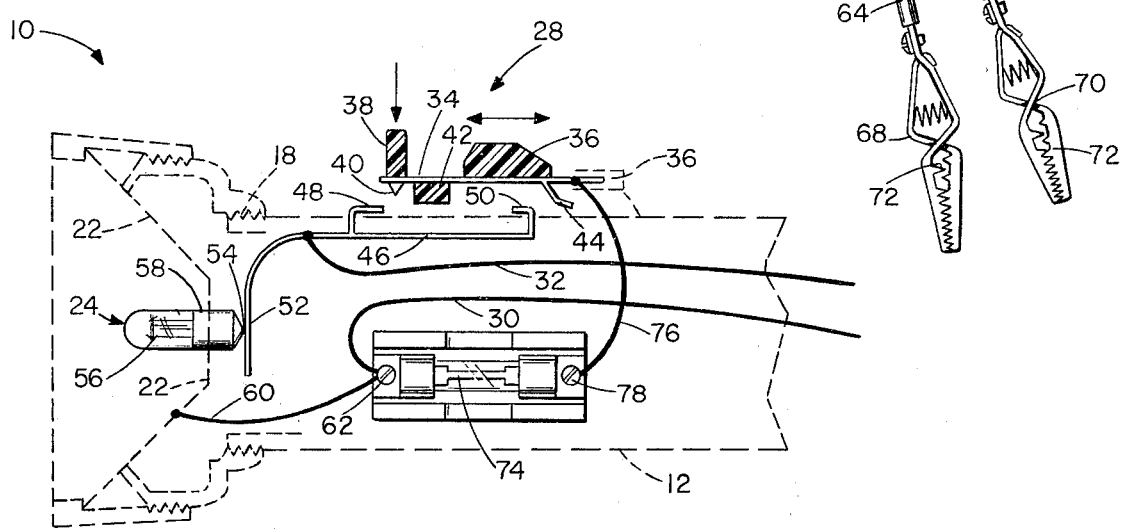
FIG. 2 is a diagrammatic detail illustrated in the view of a longitudinal partial section of the FIG. 1 invention.

FIGS. 1 and 2 show an embodiment 10 of the invention in the form of a flashlight-type casing havving a cylindrical, tubular body 12 with screw threads 14 at the rear end for mounting of screw cap 16 (shown removed) and screw threads 18 at the front and mounting threaded annular flange 20. Annular flange 20 in turn mounts Narabolic reflector 22, in the center of which an electric lamp 24 screws or otherwise conventionally attaches. The reflector 22 is shown as being metallic and the remainder of the parts as being hard rubber, plastic or other suitable insulative material.

A fuse block 26 is affixed to the exterior of the body 12 and connected electrically in a manner described later after description of switch 28 mounted adjacent to it. Clip heads 30, 32 are adapted to extend from inside body 12.

Switch 28 includes a switch strip 34 held in a slide opening 36 in the body 12 so that it can be slid back and forth. The upper part of the switch strip 34 includes both a lug 36 for sliding the switch strip in the direction of the double ended arrow and a button 38. Beneath the button is a downwardly facing contact 40 which is electrically continuous with the switch strip 34. Pressure on the button in the direction shown by the downward arrow in FIG. 2 resiliently deflects switch strip 34 downward. An insulative pad 42 cemented or otherwise suitably held to the underside of the switch strip 34 protrudes downward slightly below the contact 40 in relation to which it is adjacently affixed. This pad urges the contact member 40 upwardly to assure the disengaging of the contact members 40 and 48.

A further contact 44 downwardly depends from the rear of the switch strip 34.

Contact block 46 held within the body 12 of the invention has two upward contacts 48 and 50 exposed and spaced for selective connection with the contacts 40 and 44 of switch strip 34. The arrangement is illustrated in the No. 1 or "off" position.

The relative spacing provides for the following progressive operation when switch strip 34 is slid forward. Beginning with the No. 1 or off position, a stable position, and sliding forward, contact 40 arrives at a position above contact 48. At this position, the No. 2 position, a push on button 40 will then deflect switch strip 34 and close the two contacts. The upper contact spring apart from the lower contact when pressure is released, affording a momentary contact facility. The insulative pad 42 which is fixed to the underside of the switch strip 34 slides along the outer surface of the casing 12, or some suitable support (not shown) for urging this switch strip 34 upwardly out of contact with the element 48.

The circuit made by this arrangement is as follows. The forward end 52 of contact block 46 curves around behind and makes contact with the center terminal 54 of lamp 24, which in turn continues the circuit through the filament 56 and the metal socket shell 58 of the lamp 24, through reflector 22, line 60, and fuse terminal 62 to clip lead 30 which preferably has a black colored identifying collar 64. Clip lead 32 connects to contact block 46 and preferably has a red colored identifying collar 66. Both clips 68 and 70 preferably have a spike 72 in the yaws for piercing insulation on wires when useful.

Fuse 74 disposed in fuse block 26 provides a shunt circuit across the leads 30 and 32 to lamp 24 by means of line 76 running from fuse terminal 78 to switch strip 46.

When not in use, clip leads 30 and 32 are stored inside body 12 and cap 16 is screwed in place to retain them.

Figure 3:
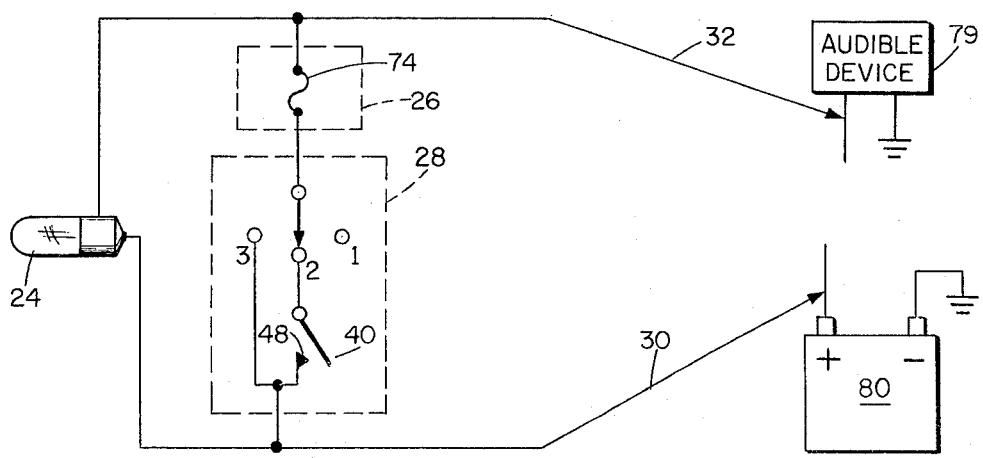
FIGS. 3 through 7 are circuit diagrams showing arrangements of the invention for testing, illumination, and control, in various respective uses with illustrative automobile accessories.

FIG. 3 diagrams the circuit described above, as it is used in high speed testing of a member of fuses 74 in succession. Lead 30 is connected to the positive terminal of the battery and lead 32 is connected to one side of the audible device 79 causing lamp 24 to come on. Switch 38 is placed in position No. 2, a fuse 74 is positioned in fuse block 26 and contacts 40 and 48 are pressed closed. If the lamp 24 goes out when thus shunted, or operates the horn, the fuse is continuous and therefore good, and is removed and replaced by another fuse to be tested. Failure of the lamp to go out when the shunt circuit is switched in indicates that the fuse is defective and should not be used.

A failsafe feature of this invention appears here in that failure of the lamp is immediately apparent, and such failure can in no case cause rejection of a good fuse or acceptance of a bad fuse.

Figure 4:
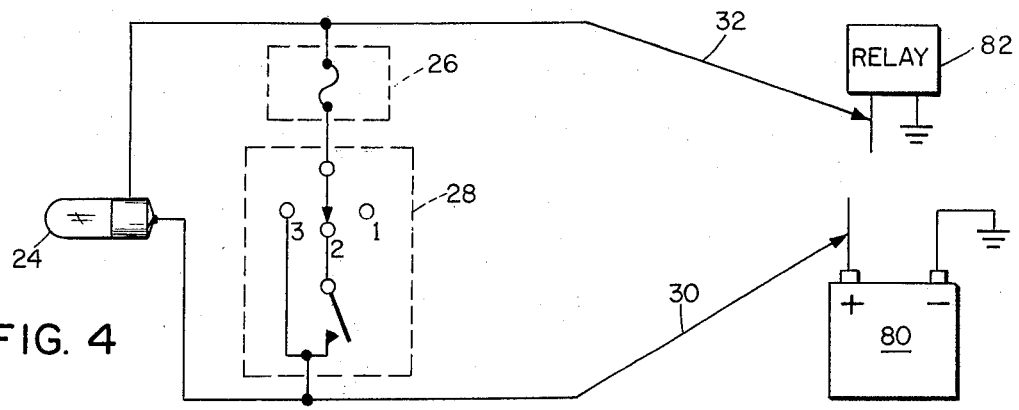

FIG. 4 shows the invention in use as a circuit controller after the lamp 24 indicates that voltage is present. The No. 2 position of switch 23 permits intermittent pressing as when actuating a relay 82, a horn, or other device which makes a momentary impulse desirable. For example, with the ignition switch off, the cylinders of an automobile engine can be successively advanced for compression testing in this manner, connecting one lead 30 to the battery 80 and another 32 to the appropriate side of the starter relay as shown.

Figure 5:
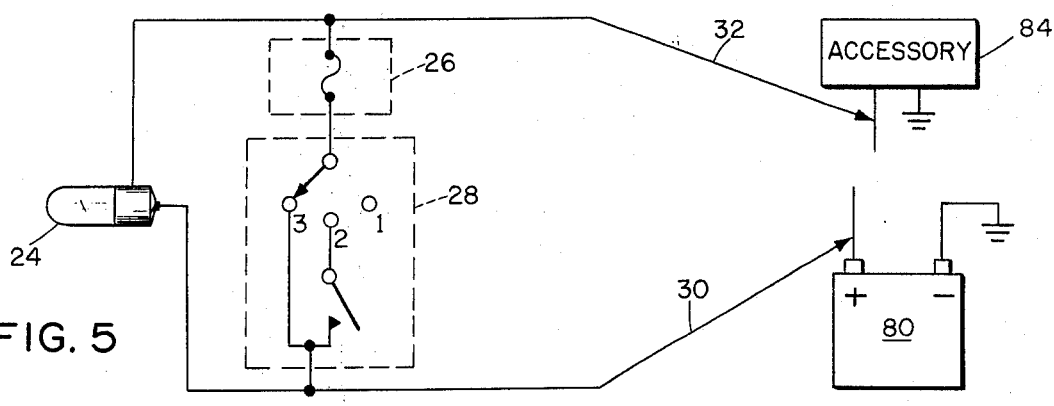

FIG. 5 shows the switch 28 in position No. 3 and connected as in FIG. 4, this time to an accessory 84 such as an automobile lighting system which requires on-off control longer than momentary.

Figure 6:
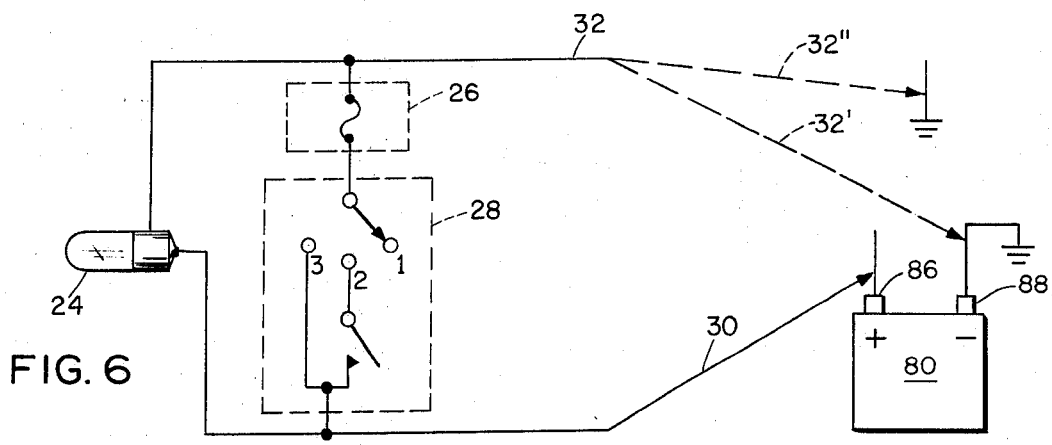

FIG. 6 shows the invention used as an under-the-hood trouble light, with the switch 28 in the No. 1 position, the invention is connected by one clip lead 30 to the hot side 86 of the battery 80 and by the other clip lead either to the opposite terminal 88 of the battery as at position 32' or to ground as at 32''. This arrangement may also be utilized in testing the ignition points. For this test, the lead 32 is placed on the negative side of the coil and the lead 30 is placed on the negative side of the battery 80. The starter is operated by the ignition switch (not shown). The light will light when the points are open and will be extinguished when the points are closed, providing the points are making electrical contact with each other.

Figure 7:
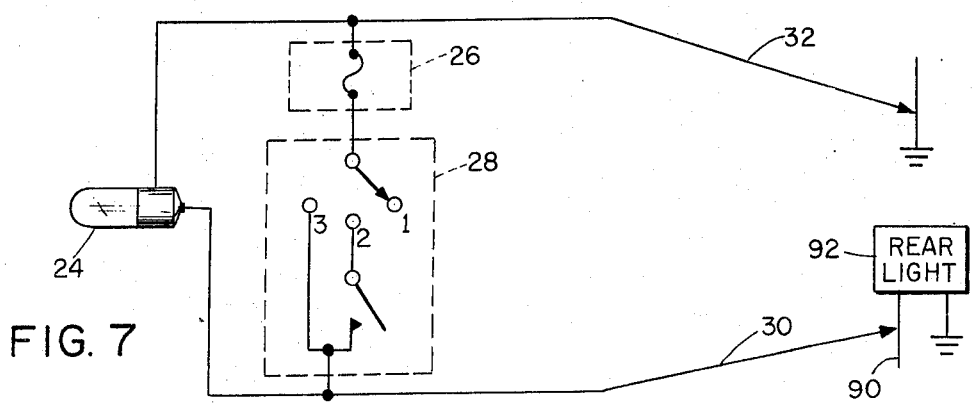

FIG. 7 shows the invention in use as a trunk light. First the auto parking lights are turned on. Again with switch 28 in the No. 1 position, one clip lead 32 is grounded and the spike of the other clip lead 30 is set into the line 90 of the parking light 92 in the trunk of the automobile. The device thus becomes an excellent trouble light for spare tire changing and the like.

Finally, it should be noted that the shunt circuit of the invention is always protected by a fuse, the value of which can be made high or low by selection of the proper fuse, so that the shunt circuit can be used to test for shorts causing devices to draw excessive current, even when the lamp 24 is unscrewed or burned out.

I claim:
1. An electric light, circuit tester and operating device for electrically operating units, comprising in combination:
    a. an elongated hollow casing having means for attaching a two terminal electric light bulb to one end thereof and a removable cap positioned over the opposite end, the inner area of the casing being of such dimension as to receive a pair of coiled current conducting cables of a length substantially greater than the length of the casing;
    b. a switch fixedly secured to the casing adjacent the light bulb end of the casing, said switch including a conductive, resiliently deflectable switch strip adapted for sliding along the outer surface of said casing and having a first contact and a second contact spaced therefrom, said first and second contacts depending from respective ends of the switch strip, said switch further including a conductive contact block fixed to said casing and having first and second contacts spaced for selective connection to the first and second contacts of the switch strip, the first contact of said switch strip being deflectable for momentary contact with the first contact of said contact block and the second contact of said switch strip being slideable for prolonged positioning into and out of engagement with the second contact of said contact block;
    c. the conductive contact block further including an extended portion connected to one terminal of the light bulb and to one end of one of the cables;
    d. means at one end of the second mentioned cable for connecting the same to the other terminal of the electric light bulb;
    e. means including a fuse for electrically connecting the end of the cable connected to the second mentioned light bulb terminal to the switch strip, the unconnected ends of said cables being adapted for connection to said electrically operating units,
whereby, any electric current will be shunted around the light bulb when the switch is closed for extinguishing the said light bulb and to operate the said unit.

2. A device as recited in claim 1, wherein an insulative pad disposed proximate and extending below the first contact of the switch strip is provided, thereby adapting the insulative pad to deflect the first contact of the switch strip upwardly from the first contact of the contact block when the said sliding contact is in engagement with the second contact of the contact block.

3. A device as recited in claim 2 wherein each of said pair of leads has a clip on the free end thereof, and wherein at least one of said clips has a spike in a jaw thereof.

* * * * *